(12) United States Patent
Chakraborty et al.

(10) Patent No.: US 9,893,716 B2
(45) Date of Patent: Feb. 13, 2018

(54) RESONANT CIRCUIT CALIBRATION

(71) Applicant: Texas Instruments Incorporated, Dallas, TX (US)

(72) Inventors: Sudipto Chakraborty, Plano, TX (US); Vinod Mukundagiri, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/293,255

(22) Filed: Oct. 13, 2016

(65) Prior Publication Data

US 2017/0117879 A1 Apr. 27, 2017

Related U.S. Application Data

(60) Provisional application No. 62/244,220, filed on Oct. 21, 2015.

(51) Int. Cl.
| | |
|---|---|
| *H03J 3/02* | (2006.01) |
| *H03J 1/00* | (2006.01) |
| *H03L 7/099* | (2006.01) |
| *H04B 5/00* | (2006.01) |
| *H04B 1/10* | (2006.01) |
| *H03D 7/16* | (2006.01) |
| *H03J 7/04* | (2006.01) |

(52) U.S. Cl.
CPC ............. *H03J 3/02* (2013.01); *H03D 7/165* (2013.01); *H03J 1/0008* (2013.01); *H03J 7/04* (2013.01); *H03L 7/0995* (2013.01); *H04B 1/10* (2013.01); *H04B 5/0031* (2013.01); *H04B 5/0037* (2013.01); *H04B 5/0093* (2013.01); *H03J 2200/10* (2013.01); *H03J 2200/28* (2013.01); *H03J 2200/29* (2013.01)

(58) Field of Classification Search
CPC ........ H03J 3/02; H03J 1/0008; H03J 2200/10; H03J 2200/28; H03J 2200/29; H03J 7/04; H03L 7/0995; H04B 1/10; H04B 5/0093; H04B 5/0031; H04B 5/0037; H03D 7/165; H03D 7/18
See application file for complete search history.

(56) References Cited

U.S. PATENT DOCUMENTS

| | | | | |
|---|---|---|---|---|
| 7,956,851 B2* | 6/2011 | Vos | ..................... | G06F 3/03545 178/18.01 |
| 8,306,157 B2* | 11/2012 | Seendripu | .............. | H03D 3/008 375/299 |
| 8,725,098 B2* | 5/2014 | Shana'a | ................... | H03H 7/40 455/136 |

(Continued)

*Primary Examiner* — Devan Sandiford
(74) *Attorney, Agent, or Firm* — Ronald O. Neerings; Charles A. Brill; Frank D. Cimino

(57) ABSTRACT

Methods and circuitry for calibrating inductive-capacitive resonant circuits are disclosed. An example of the circuitry includes an inductive-capacitive (L-C) resonant circuit operable to receive signals in response to induced electromagnetic signals transmitted on a carrier frequency. A demodulator has a signal source and is operable to demodulate signals generated by the L-C resonant circuit. Switching circuitry is operable to inject signals generated by the signal source into the L-C resonant circuit during a calibration mode. The calibration mode is for adjusting the capacitance in the L-C resonant circuit to tune the L-C resonant circuit to the carrier frequency.

21 Claims, 5 Drawing Sheets

(56) References Cited

U.S. PATENT DOCUMENTS

| | | | |
|---|---|---|---|
| 9,270,289 B2* | 2/2016 | Walker | H03L 7/099 |
| 2003/0176174 A1* | 9/2003 | Seppinen | H04B 17/20 |
| | | | 455/226.1 |
| 2006/0001559 A1* | 1/2006 | Tuttle | H04B 1/18 |
| | | | 341/120 |
| 2007/0018743 A1* | 1/2007 | Sheng | H03J 1/005 |
| | | | 331/177 V |
| 2008/0171524 A1* | 7/2008 | Heng | H03J 3/28 |
| | | | 455/150.1 |
| 2009/0091396 A1* | 4/2009 | Jian | H03L 7/099 |
| | | | 331/16 |
| 2009/0174529 A1* | 7/2009 | Hertwig | G06K 19/0723 |
| | | | 340/10.5 |
| 2009/0267561 A1* | 10/2009 | Lin | H02J 7/025 |
| | | | 320/108 |
| 2010/0151806 A1* | 6/2010 | Firoiu | H04B 1/30 |
| | | | 455/192.2 |
| 2011/0133982 A1* | 6/2011 | Goshen | G01S 7/4004 |
| | | | 342/174 |
| 2011/0275341 A1* | 11/2011 | Landmark | H04B 1/109 |
| | | | 455/318 |
| 2014/0268904 A1* | 9/2014 | Reddy | H02M 3/337 |
| | | | 363/21.02 |
| 2014/0355655 A1* | 12/2014 | Chakraborty | H04B 1/40 |
| | | | 375/219 |
| 2015/0229316 A1* | 8/2015 | Walker | H03L 7/099 |
| | | | 331/2 |

* cited by examiner

RESONANT CIRCUIT CALIBRATION

RELATED APPLICATION

This application claims the benefit of U.S. Provisional Patent Application No. 62/244,220, filed Oct. 21, 2015, entitled "SYSTEMS AND METHODS FOR CALIBRATING L-C RESONANANCE CIRCUITS", of Sudipto Chakraborty, et al., which is incorporated herein in its entirety.

BACKGROUND

Inductor-capacitor (L-C) resonant circuits (also known as tank circuits) are widely used in electronic systems, for example for clock signals, oscillators, switching power supplies, and wireless communications. One common measure used to characterize L-C resonant circuits is the Q-factor (also known as the quality factor). One definition of Q-factor for L-C circuits is the resonant frequency of an L-C resonant circuit divided by the half-power bandwidth of the L-C resonant circuit. In some systems, for maximum efficiency and sensitivity, the L-C resonant circuit must be calibrated to maximize the Q-factor at a predetermined frequency. In some calibration processes, a modulated test tone is injected into the L-C resonant circuit using external instrumentation, which is time consuming and complex. In some systems, components used for calibration cause additional loading of the L-C resonant circuit, which affects measurement accuracy and may provide unwanted coupling to noise sensitive circuits. There is a need for a simple, fast, and accurate calibration mechanism for L-C resonant circuits.

SUMMARY

Methods and circuitry for calibrating inductive-capacitive (L-C) resonant circuits are disclosed. An example of the circuitry includes an L-C resonant circuit operable to receive signals in response to induced electromagnetic signals transmitted on a carrier frequency. A demodulator has a signal source and is operable to demodulate signals generated by the L-C resonant circuit. Switching circuitry is operable to inject signals generated by the signal source into the L-C resonant circuit during a calibration mode. The calibration mode is for adjusting the capacitance in the L-C resonant circuit to tune the L-C resonant circuit to the carrier frequency.

DETAILED DESCRIPTION

Figure 1:
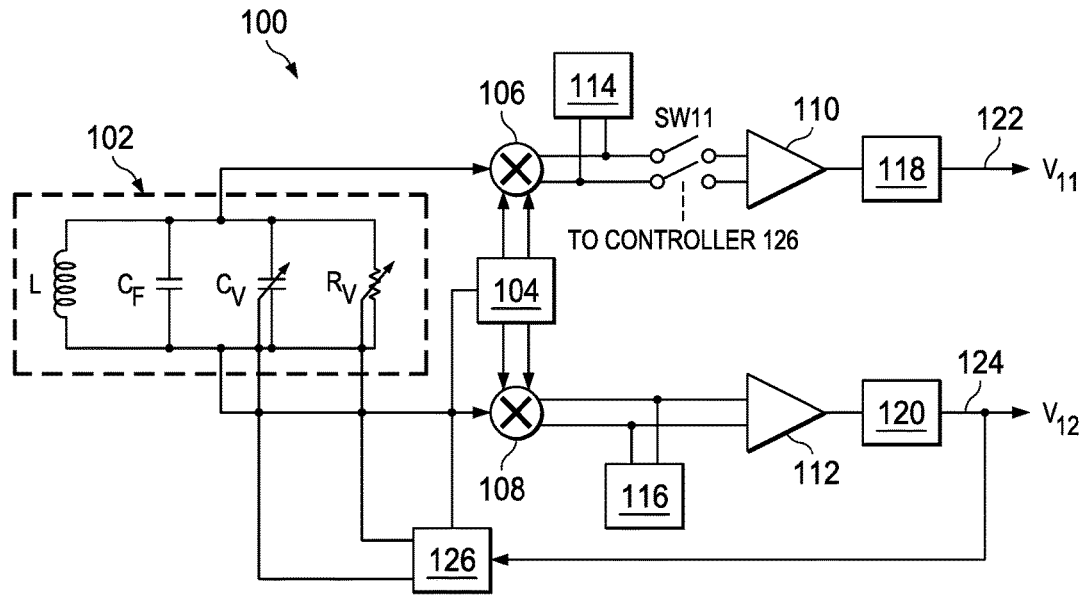
FIG. 1 is a block diagram of an example embodiment of circuitry that includes an L-C resonant circuit.

FIG. 1 is a block diagram of an example of circuitry 100 that includes an L-C resonant circuit 102. Both the circuitry 100 and the resonant circuit 102 may be formed in a microcircuit. In general, capacitors, including capacitors formed in microcircuits, have some inherent tolerance limits due to manufacturing variations. Circuits in general, including microcircuits, include some inherent variable stray capacitance. Therefore, as initially manufactured, there is some inherent variation in the resonant frequency and bandwidth of the L-C resonant circuit 102 due to the variance in capacitance. The L-C resonant circuit 102 is initially manufactured with a fixed capacitor $C_F$. During manufacturing, a calibration process is implemented to adjust the resonant frequency of the resonant circuit 102 by adjusting a variable capacitor $C_V$. The values of the capacitors $C_F$ and $C_V$ are referred to as the capacitances $C_F$ and $C_V$. In addition, the calibration process may adjust the bandwidth of the resonant circuit 102 by adjusting a variable resistor $R_V$. The resistance of the variable resistor $R_V$ is referred to as the resistance $R_V$.

In the example resonant circuit 102 of FIG. 1, an Inductor L and the capacitors $C_F$ and $C_V$ are coupled in parallel. The calibration processes disclosed herein are equally applicable to resonant circuits in which an inductor and at least one capacitor are coupled in series. In some examples, a parallel L-C resonant circuit is implemented as an antenna that is configured for receiving a signal transmitted by a targeted sensor. In other examples, a series L-C resonance circuit is implemented to perform impedance transformation between a circuit and an antenna for maximum power transfer.

The circuitry 100 is an example of an active wireless receiver used in a near-field communication (NFC) system. In NFC systems, a transmitter induces signal currents in a magnetically coupled receiver having an L-C resonant circuit in a parallel L-C configuration. NFC systems are used, for example, in wireless data transmissions within automobiles and airplanes, and in wireless data transmissions between financial transaction terminals and personal electronic devices such as cell phones and watches. In NFC systems, the receiver must be close enough to the transmitter to be magnetically coupled, effectively forming an air-core transformer. This requirement for close proximity between the transmitter and the receiver has several advantages, including reduced interference with other systems in the proximity of the system and increased security. For example, only a nearby magnetically coupled NFC system can receive the transmitted data. In general, a high-Q L-C resonant circuit is needed for selectivity, power efficiency, and maximum data transfer rate in an NFC system. The circuitry 100 may be operated in a time division duplex (TDD) mode or a frequency division duplex (FDD) mode. In addition, the circuitry 100 can be configured as one of several types of transceiver systems, and the calibration works with all of the transceiver configurations.

NFC systems commonly use an amplitude-modulated signal. In an NFC amplitude-modulated transmitter, an Information signal (also known as the baseband signal) modulates the amplitude of a high frequency transmission signal (also known as the carrier signal). To provide maximum selectivity (i.e. image rejection) and digital calibration to combat analog circuit impairments, quadrature signal processing may be used in the receiver. One common type of receiver circuit for demodulating an amplitude modulated signal is an IQ demodulator, wherein the circuitry 100 is an example of an IQ demodulator. In an NFC receiver having an IQ demodulator, the received modulated carrier signal is multiplied by a signal, such as a local oscillator signal, having a frequency close to the Input carrier signal. The result of the multiplication is one signal component having the sum of the two carrier frequencies and a second signal component having the difference of the two carrier frequencies. A low-pass filter or a band-pass filter removes the sum frequency, leaving the difference frequency or baseband signal. In contrast to commonly available IQ demodulator circuits, the IQ demodulator circuit in the circuitry 100 can be switched to a calibration mode, as discussed further below. The L-C resonant circuit 102 is calibrated using the internal IQ demodulator circuitry that is also used for normal operation of the circuitry 100. That is, no external signal source is needed for calibration and there is no additional loading on the L-C resonant circuit 102 during calibration.

There are several standards for the frequency of the carrier signal in NFC systems. One standard specifies a carrier frequency of 13.56 MHz. For maximum efficiency and sensitivity, the L-C resonant circuit 102 needs to have a resonant frequency equal to a predetermined input carrier frequency, which in the standard above is 13.56 MHz. During calibration, the circuitry 100 adjusts the variable capacitor $C_V$ in the L-C resonant circuit 102 so that the resonant frequency of the L-C resonant circuit 102 is at the predetermined input carrier frequency. In addition, during calibration, the circuitry 100 may adjust the variable resistor $R_V$ to adjust the bandwidth of the L-C resonant circuit 102. In the following description, the normal operation of circuitry 100 will be described followed by a description of the calibration process.

In the following description, the input carrier frequency is designated as $f_1$ and the resonant frequency of the L-C resonant circuit 102 is designated as $f_R$. During normal operation of the circuitry 100 a switch SW11 is closed and a transmitter (not shown) is magnetically coupled to the resonant circuit 102. The magnetical coupling causes the resonant circuit 102 to receive signals generated by the transmitter. A frequency and phase-selector circuit 104 provides quad-phase signals at the frequency $f_1$. Mixers 106 and 108 mix the signals output by the resonant circuit 102 with the signals generated by the frequency and phase selector circuit 104. For example, mixer 106 may receive phases 0° and 180° from the frequency and phase selector circuit 104 and mixer 108 may receive phases 90° and 270° from the frequency and phase selector circuit 104. The mixed signals generated by the mixers 106 and 108 are amplified by baseband amplifiers 110 and 112. Two current generators 114 and 116, such as digital-to-analog converters (iDACs), compensate (remove) any DC offsets at the Inputs to the amplifiers 110 and 112. A first analog filter circuit 118 generates a first output signal $V_{11}$ at a first output 122 and a second analog filter circuit 120 generates a second output signal $V_{12}$ at a second output 124. Both the first and second analog filter circuits 118 and 120 may be active or passive. The first output signal $V_{11}$ at the first output 122 is the magnitude of an in-phase signal component and the second output signal $V_{12}$ at the second output 124 is the magnitude of a quadrature signal component.

A controller or processor 126 controls whether the frequency and phase selector circuit 104 is operating in a normal mode or in a calibration mode. During calibration, the controller 126 controls the frequencies generated by the frequency and phase selector circuit 104. The controller also opens a switch SW11, which prevents signals from being input to the amplifier 110. In addition, during calibration, the controller 126 receives the second signal $V_{12}$ and computes an appropriate value for the variable capacitor $C_V$. Based on this computation, the controller 126 adjusts the variable capacitor $C_V$ to the appropriate value in order to make the resonant frequency $f_R$ equal to the carrier frequency $f_1$, as discussed in greater detail below. In addition, during calibration, the controller 126 adjusts the variable resistor $R_V$ to optimize the bandwidth of the resonant circuit 102, as discussed in greater detail below.

Figure 2A:
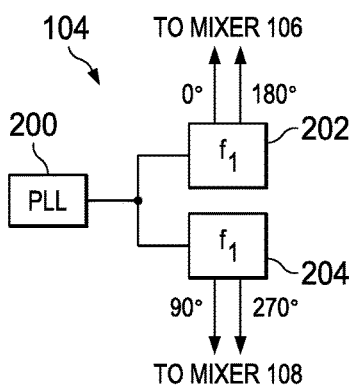
FIG. 2A is a block diagram showing an example of additional detail for a frequency and phase selector circuit in the circuitry of FIG. 1 during normal operation.

FIG. 2A shows an example of additional detail for the frequency and phase selector circuit 104 during normal operation. A phase-locked-loop (PLL) 200 controls two oscillators, such as voltage-controlled ring oscillators, 202 and 204, each operating at the carrier frequency $f_1$. Typically, these oscillators 202 and 204 provide good frequency resolution and may be realized using fractional-N topology. During normal operation, the oscillator 202 provides phases 0° and 180° at the frequency $f_1$ and the oscillator 204 provides phases 90° and 270° at the frequency $f_1$.

Figure 2B:
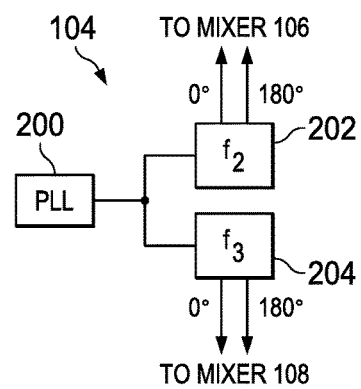
FIG. 2B is a block diagram showing an example of additional detail for a frequency and phase selector circuit in the circuitry of FIG. 1 in a first calibration mode.

During calibration, the frequency and phase selector circuit 104 is switched to a calibration mode. FIG. 2B shows an example of additional detail of the frequency and phase selector circuit 104 during a first calibration mode. In the first calibration mode, the frequency and phase selector circuit 104 generates two signals having two different frequencies, $f_2$ and $f_3$. The oscillators 202 and 204 may have slightly different frequencies while still being phase locked to the PLL 200. The frequencies $f_2$ and $f_3$ are slightly different from each other such that their difference (i.e. abs(f2−f3)) is within the 3 dB bandwidth of the filter circuits 118 and 120, FIG. 1. For example, the carrier frequency $f_1$ may be 13.56 MHz, and $f_3-f_2$ may be less than 1 MHz. It is noted that the filter circuit 118 is not used in the calibration process.

With additional reference to FIG. 1, during the first calibration mode, the IDAC 114 provides a DC offset current. This DC offset current is chopped (upconverted) to the frequency $f_2$ by the mixer 106. The resulting current having the frequency $f_2$ is injected into the resonant circuit 102 where a signal that is proportional to the impedance of the resonant circuit 102 at the frequency $f_2$ is passed. The mixer 108 mixes the resulting signal with the differential phase of the signal generated by the oscillator 204 at the frequency $f_3$. The iDAC 116 removes any DC offset at the inputs of the amplifier 112. The filter 120 removes high frequency components and the resulting signal $V_{12}$ at the output 124 has a frequency of $f_3-f_2$, which is sometimes referred to as the filtered signal $V_{12}$. The amplitude of the filtered signal $V_{12}$ having a frequency of $f_3-f_2$ is proportional to the impedance of the resonant circuit 102 at an average frequency of $0.5(f_2+f_3)$. It is noted that $|f_3-f_2|\ll(f_3,f_2)$, and under this condition, the arithmetic mean of the two frequencies equals the geometric mean of the two frequencies. The controller 126 then determines the value of the variable capacitor $C_V$ that will cause the resonant frequency $f_R$ of the resonant circuit 102 to equal or be substantially equal to the carrier frequency $f_1$.

One method for determining the resonant frequency $f_R$ is to measure the impedance by way of the amplitude of the filtered signal $V_{12}$ at multiple values of the frequency $f_2$ with the frequency $f_3-f_2$ fixed. This can be obtained by changing the frequency $f_2$ using an oscillator, such as an on-chip oscillator, or synthesizing different $f_3-f_2$ values using a multi-modulus divider and an offset mixing technique (i.e. $f_3=f_2\pm f_2/N$, where N is an integer). The value of the frequency $f_2$ that results in the maximum impedance indicates the resonant frequency $f_R$ of the resonant circuit 102. Alternatively, given several values for impedance as a function of frequency, successive approximation and interpolation, or other curve fitting methods (for example, a second degree polynomial fit through three sample values) may be used to determine the resonant frequency $f_R$.

Equation (1) is the equation for the resonant frequency $f_R$ of the resonant circuit 102 with the value of the variable capacitor $C_V$ equal to zero. Given the resonant frequency $f_R$ (measured as discussed above) and the inductance L of the resonant circuit 102, equation (1) may be used to determine the value of the fixed capacitor $C_F$.

$$f_R = \frac{1}{2\pi\sqrt{LC_F}} \quad \text{Equation (1)}$$

In equation (2), an unknown variable capacitance $C_V$ is added to adjust the resonant frequency $f_R$ of the resonant circuit 102 to the carrier frequency $f_1$.

$$f_1 = \frac{1}{2\pi\sqrt{L(C_F+C_V)}} \quad \text{Equation (2)}$$

Equation (3) provides the variable capacitance $C_V$ in terms of known values ($C_F$, $f_R$, and $f_1$). The controller 126 computes the variable capacitance $C_V$ and adjusts the variable capacitance $C_V$ as discussed below.

$$C_V = \frac{C_F(f_R^2 - f_1^2)}{f_1^2} \quad \text{Equation (3)}$$

Equation (4) provides the Impedance $Z_R$ of the resonant circuit 102 at the resonant frequency $f_R$ in terms of a desired quality factor Q, inductance L, and total capacitance C, wherein the total capacitance C is equal to the sum of the fixed capacitance $C_F$ and the variable capacitance $C_V$.

$$Z_R = Q\sqrt{\frac{L}{C}} \quad \text{Equation (4)}$$

Given a total capacitance C being equal to the sum of the fixed capacitance $C_F$ and the variable capacitance $C_V$ as described, and given Q is equal to the resonant frequency $f_R$ divided by the bandwidth BW, equation (5) provides the impedance $Z_R$ in terms of known quantities. Given the impedance $Z_R$, the value of the variable resistor $R_V$ can be calculated and adjusted to obtain the desired bandwidth BW.

$$Z_R = \frac{f_1}{BW\sqrt{\frac{L}{C}}} \quad \text{Equation (5)}$$

Figure 3:
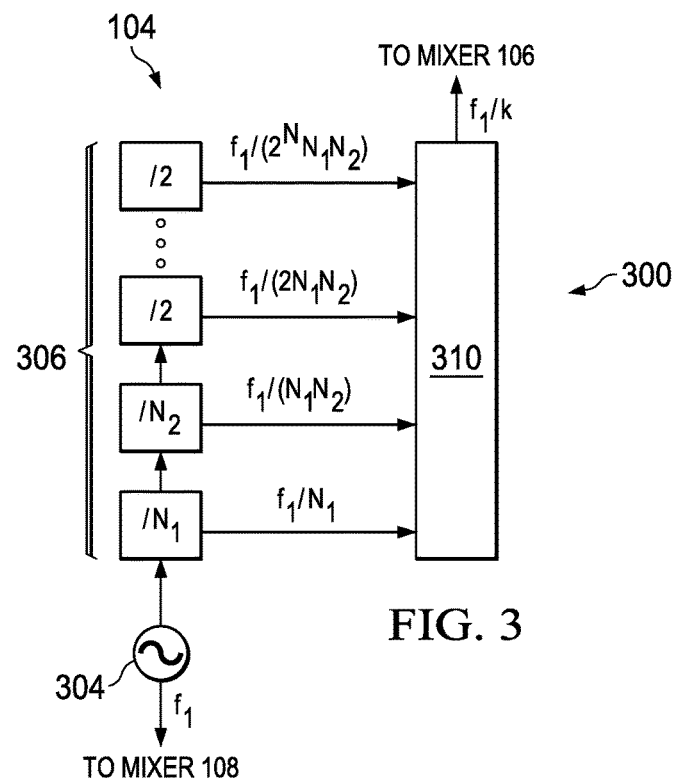
FIG. 3 is a block diagram showing an example of additional detail for an alternative embodiment of a frequency and phase selector circuit in the circuitry of FIG. 1 in a second calibration mode.

FIG. 3 illustrates an alternative embodiment and circuitry 300 of the frequency and phase selector circuit 104 operating in a second calibration mode. The alternative embodiment of FIG. 3 reduces the measurement time by using only one two-frequency measurement and the resonant frequency $f_R$ and bandwidth BW are both adjusted in one step. In the embodiment of FIG. 3, an oscillator 304 generates a single frequency $f_1$, which is sent to the mixer 108 of FIG. 1. A series of digital dividers 306 provides a frequency $f_1$ divided by predetermined divisors. In the example of FIG. 3, there are k divisors. A selector 310 selects one of the divisor outputs ($f_1/k$) and the corresponding frequency is sent to the mixer 106 of FIG. 1. The mixer 106 generates two frequencies, $f_R+f_1/k$ and $f_R-f_1/k$, that are injected into the resonant circuit 102. The variable k is selected to provide the desired bandwidth. Assuming the frequency $f_1$ is the desired resonant frequency, and a frequency $f_{3db}$ is half the 3 dB bandwidth, these frequencies are given as $f_2=f_r+f_{3db}$, and $f_3=f_r-f_{3db}$. Since any L-C resonant circuit provides a second order monotonic characteristic for impedance, the voltages corresponding to these frequencies are obtained at the output 124, FIG. 1, of the filter 120 wherein the voltage $V_{12}$ in this embodiment is referred to as $V(f_2)$ and $V(f_3)$, and wherein the voltages $V(f_2)$ and $V(f_3)$ are proportional to the L-C impedances at these frequencies. For example, the impedance $Z(f_2)$ is proportional to the voltage $V(f_2)$ and the impedance $Z(f_3)$ is proportional to the voltage $V(f_3)$. The voltages $V(f_2)$ and $V(f_3)$ are made equal by setting the appropriate value for the variable capacitor $C_V$. Hence, both the resonant frequency calibration and the bandwidth calibration can be performed in one step.

Figure 4:
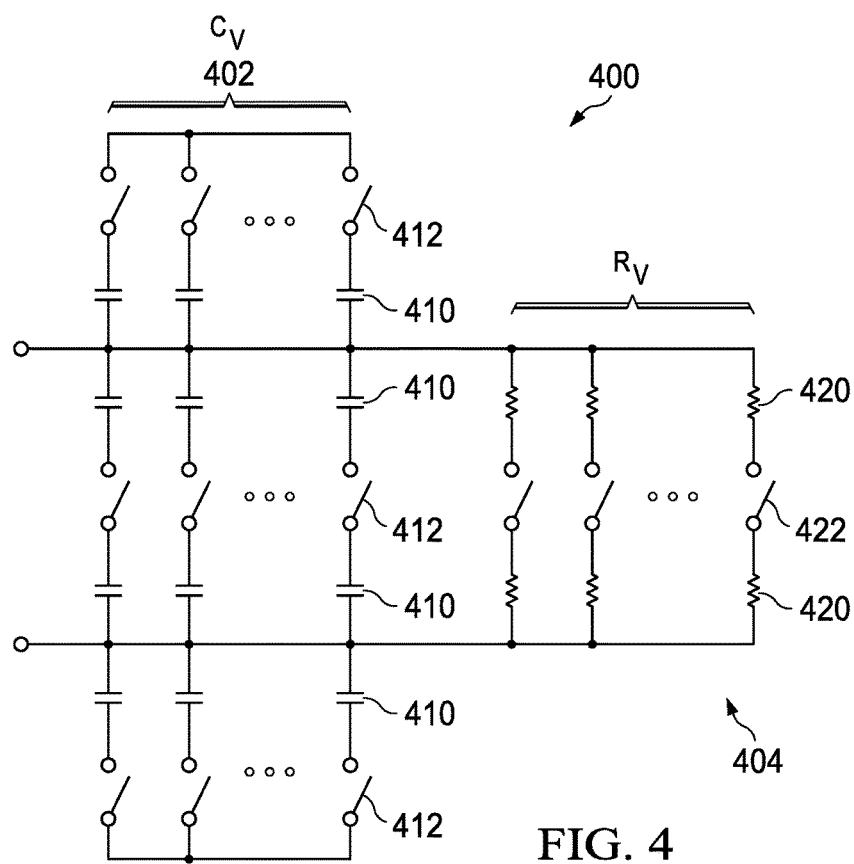
FIG. 4 is a schematic diagram of an example embodiment of an array constituting the variable capacitor and the variable resistor in the circuitry of FIG. 1.

FIG. 4 is a schematic diagram of an example embodiment of an array 400 constituting the variable capacitor $C_V$ and variable resistor $R_V$ illustrated in FIG. 1. The array 400 of FIG. 4 is a weighted capacitor array 402 and weighted resistor array 404, which is one example of a switch-controlled variable capacitor $C_V$ and switch-controlled variable resistor $R_V$. There are multiple capacitors 410 and multiple switches 412 in the capacitor array 402. The switches 412 are controlled by the controller 126 of FIG. 1. The overall capacitance of the capacitor array 402 is adjusted by selecting which capacitors 410 in the capacitor array 402 are coupled in series and parallel. In addition, there are multiple resistors 420 and switches 422 in the resistor array 404. The overall resistance of the resistor array 404 is adjusted by selecting which resistors 420 are coupled in series and in parallel.

As described herein, there are several methods for performing the calibration. For example, the measurement methods described above may include detection of amplitude and phase information. The different calibration methods have trade-offs in terms of calibration time required. In the first method, the frequency and phase selector network 104 configures one of the oscillators 202 or 204 to generate a signal with the desired resonant frequency. The signal has an amplitude proportional to the DC offset current generated by the iDAC 114. The mixer 108 upconverts the signal passed by the resonant circuit 102 and the processor 126 measures the amplitude and phase of the signal $V_{12}$ at the output of 124. The first step in the calibration procedure involves adjusting the capacitance in the resonant circuit 102 so that the phase at the output 124 is zero or a minimum. Adjusting the capacitance in the resonant circuit 102 involves adjusting the variable capacitor $C_V$, which may be performed by adjusting the capacitor array 402 as shown in FIG. 4. When the phase at the output 124 is zero or a minimum, the resonant circuit 102 is at resonance. A second tone having the desired bandwidth point, amplitude, and phase is injected into the resonant circuit 102. At the bandwidth point, the amplitude is adjusted to be 3 dB lower and the phase is adjusted to be ±45° relative to the first signal injected into the resonant circuit 102. The variable resistor $R_V$ in the resonant circuit 102 is adjusted to achieve the amplitude and phase described above. For example, the resistor array 404 of FIG. 4 may be adjusted to achieve the amplitude and phase described above.

Figure 5:
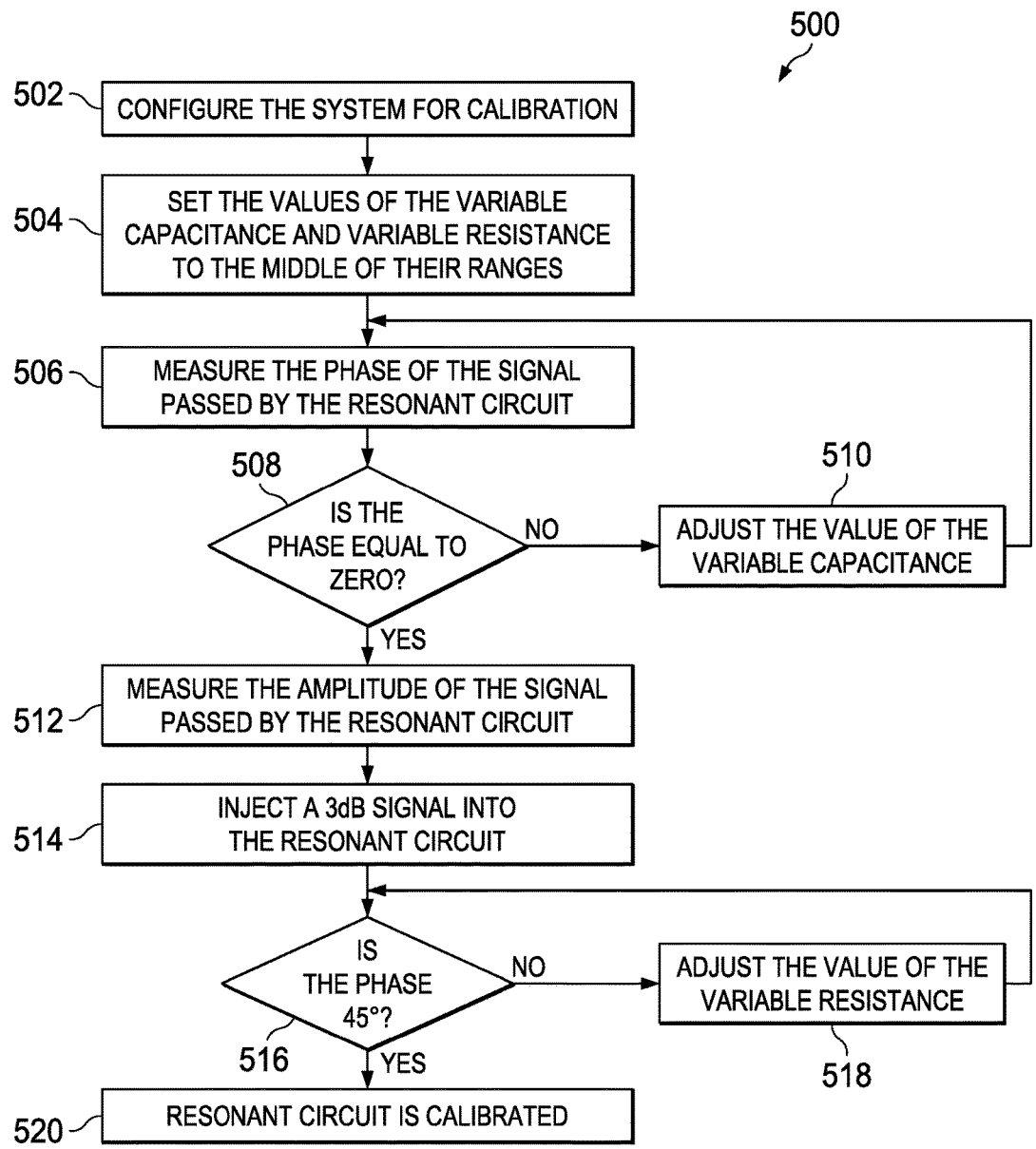
FIG. 5 is a flowchart describing an example of the first calibration mode.
Figure 6:
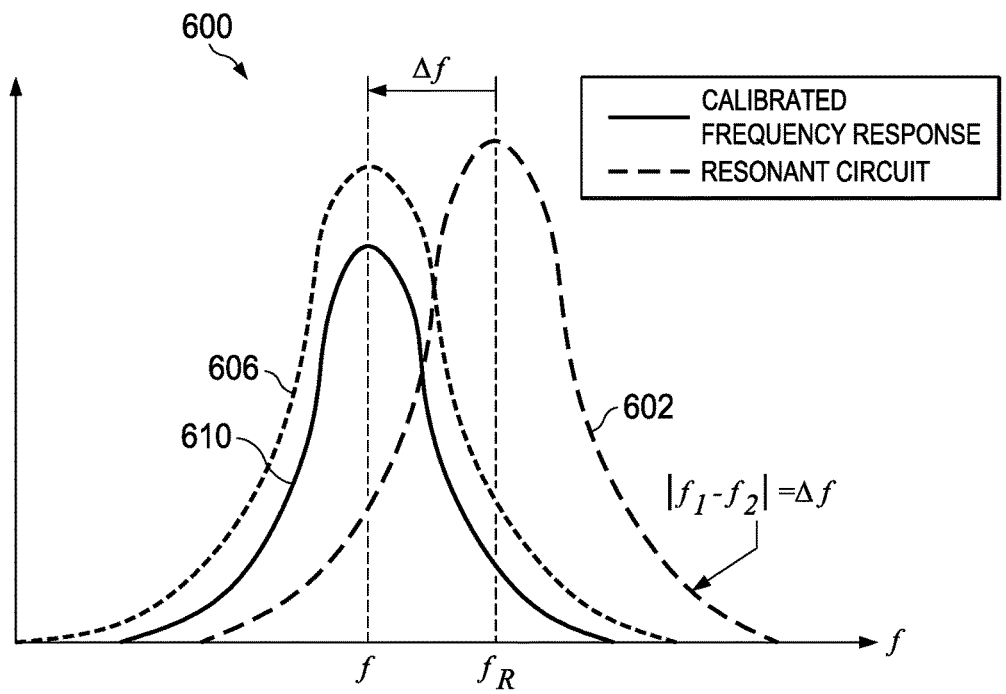
FIG. 6 is a frequency diagram showing an exemplary frequency response of the resonant circuit during a calibration mode.

FIG. 5 is a flowchart 500 describing another example of the first calibration process and FIG. 6 is a frequency diagram 600 showing the frequency response of the resonant circuit 102 during the calibration process. The process commences at block 502 with configuring the circuitry 100 for calibration. The configuring involves instructing the oscillator 202 to generate signals having a frequency $f_2$ with zero and 180° phase. The frequency response of the resonant circuit 102 is shown by a frequency response graph 602 in FIG. 6. As shown, the resonant frequency $f_R$ is not equal to a carrier frequency $f_2$ at this point. In some examples, the values of the variable capacitor $C_V$ and the variable resistor $R_V$ are set to the middle of their ranges per block 504. Setting the values of the variable capacitor $C_V$ and the variable resistor $R_V$ to the middle of their ranges enables the widest possible variation in their values during calibration.

In step 506 the phase of the signal passed by the resonant circuit 102 is measured. Decision step 508 determines if the phase is zero or a minimum value. The zero or minimal phase indicates the L-C portion of the resonant circuit 102 is tuned to the carrier frequency $f_2$ as shown by the graph 606. As shown in FIG. 6, the center frequency is shifted a value $\Delta f$ between the graph 602 and the graph 606. If the response of the decision block 508 is negative, processing proceeds to step 510 where the value of the variable capacitor $C_V$ is changed. Processing then proceeds back to step 506 to measure the phase of the signal passed by the resonant circuit 102. If the response of the decision step 508 is affirmative, processing proceeds to step 512 where the amplitude of the signal passed by the resonant circuit 102 is measured.

Processing then proceeds to step 514 where the 3 dB signal, based on step 512, is injected into the resonant circuit 102. Decision step 516 determines if the phase of the signal passed by the resonant circuit 102 is 45°, which corresponds to the graph 610 where the bandwidth is set at the center frequency, which provides the correct Q factor. If the result of the decision step 516 is negative, processing proceeds to step 518 where the value of the variable resistor $R_V$ is changed. Processing then proceeds again to decision step 516 to determine if the phase is 45°. The variable resistor $R_V$ is changed until the phase is 45°, indicating that the 3 dB bandwidth has been set. When the phase is equal to 45°, the resonant circuit 102 is calibrated as noted in step 520.

In the second calibration embodiment, the variable capacitance $C_V$ is set to zero and an upconverted signal having the desired frequency $f_2$ is injected into the resonant circuit 102. A lookup table is stored in a memory device, such as in the processor 126, that provides amplitude and phase information with respect to fractional frequency offset from the resonant frequency $f_R$ of the uncompensated resonant circuit 102 as shown with respect to FIG. 3. Equation (6) is used to derive the total capacitance C based on a known inductance value L and the known resonant frequency $f_R$.

$$LC = \frac{1}{4\pi^2 f_R^2} \qquad \text{Equation (6)}$$

The variable capacitor $C_V$ is changed to the maximum capacitance available and the frequency is measured again and noted as the frequency $f_M$. Equation (7) is applied to derive the changes in the variable capacitance $C_V$, wherein N is the number of capacitance possibilities for the variable capacitor $C_V$. The change in capacitance from one value of N to the next value of N is referred to as the unit capacitance $\Delta C$.

$$\frac{\Delta C}{C} = \frac{1}{N}\left[1 - \left(\frac{f_M}{f_R}\right)^2\right] \qquad \text{Equation (7)}$$

Equation (7) leads to a measurement of manufacturing variation of the unit capacitance $\Delta C$ by comparing the measured $\Delta C$ from equation (7) with a stored value of nominal capacitance in a lookup table. Using the closed form of the second order L-C tank circuit in the resonant circuit 102, the impedance $Z_T$ is derived from equation (8) as follows:

$$|Z_T|^2 = \frac{R^2 L^2 \omega^2}{R^2(1 - LC\omega^2)^2 + L^2\omega^2} \qquad \text{Equation (8)}$$

The amplitude of the signal passed by the resonant circuit 102 is measured at three frequencies, $f_1$, $f_2$, $f_3$, and three power values, $P_{RX1}$, $P_{RX2}$, $P_{RX3}$, respectively. The value of L/R is obtained with a nominal value of L. The remaining variables are calculated based on equation (9) as follows wherein the LC term is described above with reference to equation (6):

$$L^2 C^2 \left[\omega_2^2 \omega_3^2 \left(\frac{P_{RX2}}{P_{RX3}}\right) - \omega_1^2 \omega_3^2 \left(\frac{P_{RX1}}{P_{RX3}}\right)\right] - \qquad \text{Equation (9)}$$
$$2LC\omega_3^2 \left(\frac{P_{RX2} - P_{RX1}}{P_{RX3}}\right) + \frac{\omega_3^2}{P_{RX3}}\left(\frac{P_{RX2}}{\omega_2^2} - \frac{P_{RX1}}{\omega_1^2}\right) +$$
$$\frac{L^2}{R^2} \frac{\omega_3^2 (P_{RX2} - P_{RX1})}{P_{RX3}} = 0$$

Figure 7:
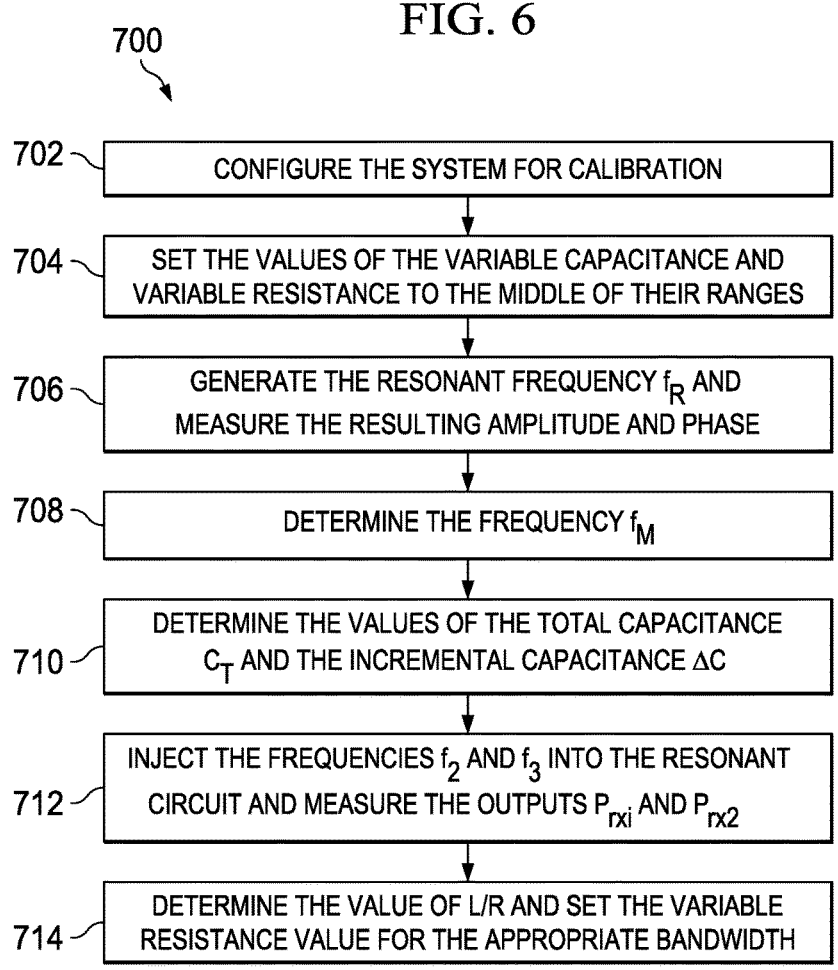
FIG. 7 is a flowchart describing an example of a second calibration mode.

This second calibration method is illustrated by the flowchart 700 of FIG. 7. In step 702, the circuitry 100 is configured for the calibration mode as described above. In step 704, the variable capacitance $C_V$ and the variable resistance $R_V$ are set to known values, such as the middle of their ranges. The frequency and phase controller 104 sets the frequency $f_2$ equal to the desired resonance frequency $f_R$ and the amplitude of the resulting signal passed by the resonant circuit 102 is measured as $P_{RX3}$ in step 706. The frequency $f_M$ is determined from a lookup table or other means in step 708. The frequency $f_M$ is the resonant frequency of the resonant circuit 102 with the variable capacitor $C_V$ set to its maximum capacitance. The values of the total capacitance $C_T$ and the incremental capacitance $\Delta C$ are determined based on the known inductance L as described above and described in step 710. The frequencies $f_2$ and $f_3$ are injected into the resonant circuit 102 and the outputs $P_{RX2}$ and $P_{RX3}$ are measured in step 712. In step 714, the value of UL/R is determined and the variable resistance value is set for the appropriate bandwidth.

Figure 8:
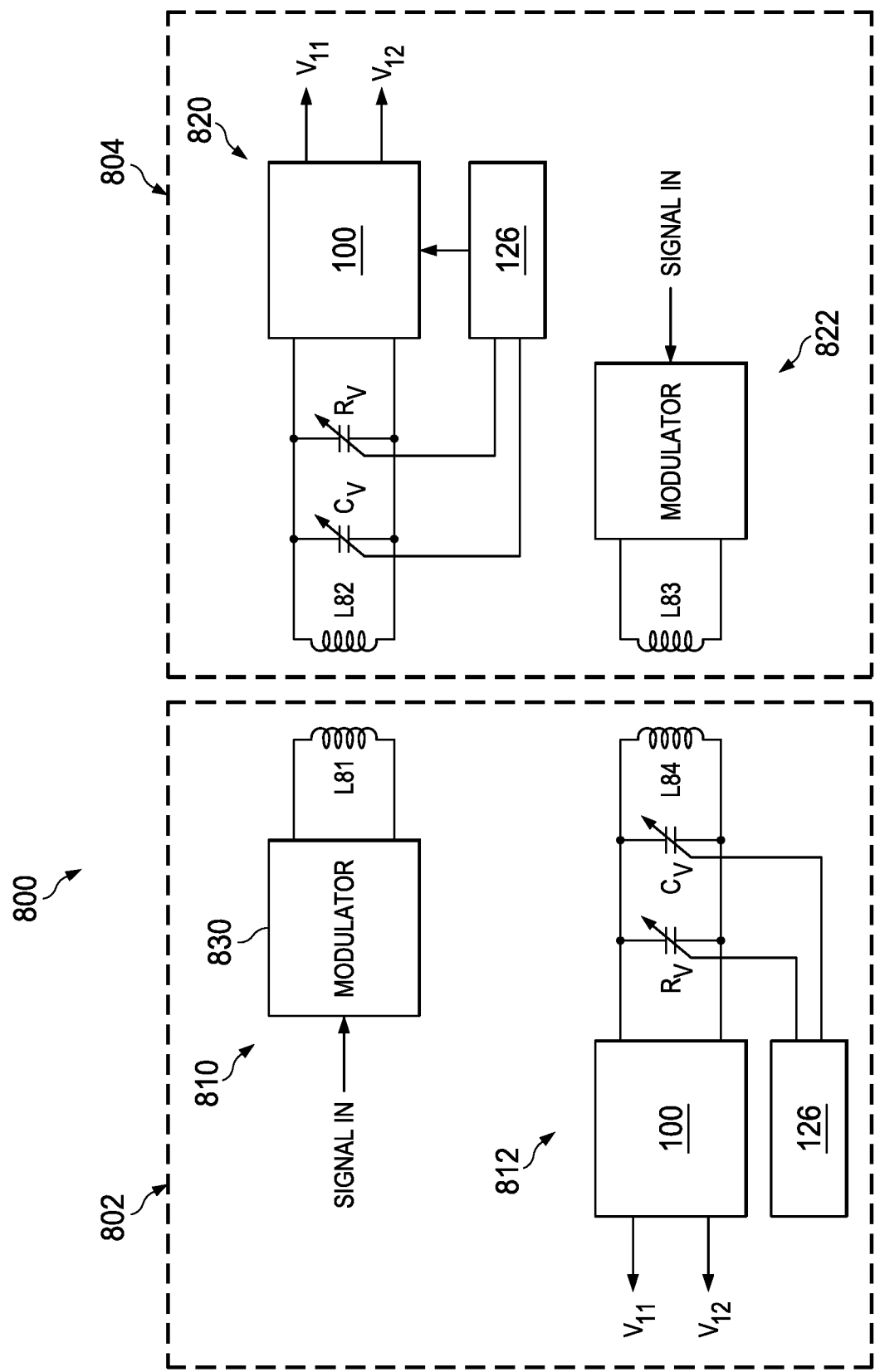
FIG. 8 is a block diagram showing L-C resonant circuits implemented in wireless communications and power devices using near-field communications.

FIG. 8 is a block diagram showing L-C resonant circuits implemented in wireless communications and power devices using near-field communications (NFC). The NFC is implemented in a wireless communication system 800 that includes a first unit 802 and a second unit 804 that communicate with each other by way of NFC. The first unit 802 includes a transmitter 810 and a receiver 812. The second unit 804 includes a receiver 820 and a transmitter 822 that communicate via NFC with the transmitter 810 and the receiver 812 of the first unit 802. The transmitter 810 in the first unit 802 includes a modulator 830 that modulates an input signal for transmission by a coil (inductor) L81. A coil L82 in the receiver 820 of the second unit receives signals generated by the coil L81 and generates current in response to the received signals. The coil L82 is tuned as described above by way of the circuitry 100 and the processor 126. The circuitry 100 further provides output signals $V_{11}$ and $V_{12}$ as described above. The transmitter 822 in the second unit 804 and the receiver 812 in the first unit 802 function in a similar or identical manner as the transmitter 810 and the receiver 820 where a coil L83 transmits and a coil L84 receives.

The circuitry 100 may also be implemented in power transfer devices. In such devices, a transmitter coil is excited with AC power and generates signals. The signals are received by a receiver coil. A rectifier rectifies the signals received by the receiver coil to provide DC power to a device. The circuitry 100 may be implemented to tune the receiver coil as described above.

Although illustrative embodiments have been shown and described by way of example, a wide range of alternative embodiments is possible within the scope of the foregoing disclosure.

What is claimed is:

1. Circuitry comprising:
    an inductive-capacitive (L-C) resonant circuit operable to receive signals in response to induced electromagnetic signals transmitted on a carrier frequency;
    a demodulator having a signal source and being operable to demodulate signals generated by the L-C resonant circuit; and
    switching circuitry operable to inject signals generated by the signal source into the L-C resonant circuit during a calibration mode, the calibration mode for adjusting the capacitance in the L-C resonant circuit to tune the L-C resonant circuit to the carrier frequency.

2. The circuitry of claim 1, wherein the L-C resonant circuit has a variable resistance, and wherein the calibration mode is for adjusting the variable resistance to set the bandwidth of the L-C resonant circuit.

3. The circuitry of claim 2, wherein setting the bandwidth of the L-C resonant circuit comprises setting the phase of the signal passed by the L-C resonant circuit relative to a signal generated by the signal source to forty-five degrees.

4. The circuitry of claim 1, wherein the signal source comprises a frequency and phase selector circuit operable to generate first and second signals having the same frequency and ninety degrees phase difference during a normal operation mode and generating first and second signals having different frequencies during a calibration mode.

5. The circuitry of claim 4, wherein the frequency and phase selector circuit comprises two oscillators synchronized to a phase-locked loop.

6. The circuitry of claim 5, wherein the two oscillators generate signals having the same frequency during normal operation and generate two signals having different frequencies during the calibration mode.

7. The circuitry of claim 4, where the frequency and phase selector circuit comprises:
    an oscillator operable to generate the first signal; and
    circuitry operable to receive the first signal and generate the second signal as the first signal is divided by a predetermined divisor.

8. The circuitry of claim 7, further comprising:
    a plurality of digital dividers coupled in series, with a first digital divider receiving the first signal and generating a signal output having a frequency that is the frequency of the first signal divided by a divisor, and each digital divider other than the first digital divider receiving an output from a preceding divider and generating a signal output; and
    a selector for selecting one of the signals from the digital dividers, wherein the selected signal is the second signal.

9. The circuitry of claim 4, further comprising:
    a first mixer coupled to the L-C resonant circuit and to the first signal from the frequency and phase selector circuit;
    a second mixer coupled to the L-C resonant circuit and to the second signal from the frequency and phase selector circuit; and
    wherein the circuitry is operable to use the amplitude of a component of a signal from the second mixer to adjust the capacitance in the L-C resonant circuit during a calibration mode.

10. The circuitry of claim 9, further comprising a filter coupled to receive the signal from the second mixer and operable to generate a filter output signal having a frequency that is the difference between the frequencies of the first and second signals.

11. The circuitry of claim 10, wherein the amplitude of the filter output signal is proportional to the impedance of the L-C resonant circuit at a frequency that is the average frequency of the first and second signals.

12. The circuitry of claim 11, further comprising a controller operable to control the frequency phase selector circuit to generate the first signal at multiple frequencies with a constant difference between the first and second frequencies, and to measure the amplitude of the filter output at each frequency of the first signal.

13. The circuitry of claim 12, wherein the controller is further operable to use the measurements of the amplitude of the filter output to determine the resonant frequency of the L-C resonant circuit.

14. The circuitry of claim 13, wherein the controller is operable to adjust a capacitance in the L-C resonant circuit so that the resonant frequency of the L-C resonant circuit is at a predetermined frequency.

15. A method for calibrating an inductive-capacitive (L-C) resonant circuit, the method comprising:
    switching a frequency and phase selector circuit generating two signals having identical frequencies when demodulating a signal to generating a first signal and a second signal having different frequencies when in a calibration mode;
    injecting the first signal into the L-C resonant circuit;

mixing a signal passed by the L-C resonant circuit with the second signal; and adjusting the capacitance in the L-C resonant circuit in response to the mixed signal.

16. The method of claim 15, further comprising:

measuring at least one amplitude of a signal passed by the L-C resonant circuit; and determining the value of a capacitance in the L-C resonant circuit that results in the resonant frequency of the L-C resonant circuit being a predetermined value.

17. The method of claim 16, further comprising computing the value of a resistance in the L-C resonant circuit that will result the bandwidth of the L-C resonant circuit being a predetermined value in response to the measured at least one amplitude.

18. The method of claim 16, further comprising:

injecting a first signal having a first frequency into the L-C resonant circuit;

mixing the resulting signal passed by the L-C resonant circuit with a second signal having a second frequency;

measuring the amplitude of a component of a signal resulting from the mixing; and adjusting a capacitance in the L-C resonant circuit in response to the measured amplitude of the component of the signal resulting from the mixing.

19. The method of claim 18, where the component of the signal resulting from the mixing has a frequency that is the difference between the first and second frequencies.

20. A near field communication (NFC) receiver, comprising:

an inductance-capacitance (L-C) resonant circuit operable to receive signals in response to induced electromagnetic signals transmitted on a carrier frequency;

a demodulator circuit coupled to the L-C resonant circuit, the demodulator circuit comprising a frequency and phase selector circuit that is operable to be switched between a first mode for normal demodulation and a second mode for calibration of the L-C resonant circuit to tune the L-C resonant circuit to the carrier frequency.

21. A wireless communication system comprising:

a first unit having a first transmitter coil and a first receiver inductance-capacitance (L-C) resonant circuit;

a second unit having a second transmitter coil and a second receiver L-C resonant circuit, wherein the first transmitter coil and the second L-C resonant circuit are in near field communication, and wherein the first L-C resonant circuit and the second transmitter coil are in near field communication;

a first demodulator circuit coupled to the first L-C resonant circuit, the first demodulator circuit comprising a frequency and phase selector circuit that is operable to be switched between a first mode for normal demodulation and a second mode for calibration of the first L-C resonant circuit to tune the first L-C resonant circuit to a carrier frequency; and a second demodulator circuit coupled to the second L-C resonant circuit, the second demodulator circuit comprising a frequency and phase selector circuit that is operable to be switched between a first mode for normal demodulation and a second mode for calibration of the second L-C resonant circuit to tune the second L-C resonant circuit to a carrier frequency.

* * * * *